US007259442B2

(12) United States Patent
Kao et al.

(10) Patent No.: US 7,259,442 B2
(45) Date of Patent: *Aug. 21, 2007

(54) SELECTIVELY DOPED TRENCH DEVICE ISOLATION

(75) Inventors: David Y. Kao, Meridian, ID (US); Rongsheng Yang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/920,579

(22) Filed: Aug. 17, 2004

(65) Prior Publication Data

US 2005/0012174 A1   Jan. 20, 2005

Related U.S. Application Data

(62) Division of application No. 09/143,585, filed on Aug. 31, 1998, now Pat. No. 6,781,212.

(51) Int. Cl.
   *H01L 29/00* (2006.01)
(52) U.S. Cl. ...................... 257/520; 257/374
(58) Field of Classification Search ............... 257/520, 257/374, 513, 506, 488
   See application file for complete search history.

(56) References Cited

U.S. PATENT DOCUMENTS

| 4,180,416 | A |   | 12/1979 | Brock |
| 4,470,062 | A |   | 9/1984  | Muramatsu |
| 4,502,914 | A |   | 3/1985  | Trumpp et al. |
| 4,624,046 | A |   | 11/1986 | Shideler |
| 4,666,556 | A |   | 5/1987  | Fulton et al. |
| 4,819,052 | A | * | 4/1989  | Hutter .................. 257/378 |
| 4,824,797 | A |   | 4/1989  | Goth |
| 4,839,301 | A |   | 6/1989  | Lee |
| 4,879,679 | A | * | 11/1989 | Kikuda et al. ............. 365/149 |
| 4,980,747 | A | * | 12/1990 | Hutter et al. ............. 257/513 |
| 5,073,509 | A |   | 12/1991 | Lee |

(Continued)

FOREIGN PATENT DOCUMENTS

EP   0 220 108   4/1987

(Continued)

OTHER PUBLICATIONS

Kikuyo Ohe, S. Odanaka, K. Moriyama, T. Hori, G. Fuse, *"Narrow-Width Effects of Shallow Trench-Isolated CMOS with $n^+$-Polysilicon Gate"*, IEEE Transactions on Electron Devices, vol. 36, No. 6, (Jun. 1989).

(Continued)

*Primary Examiner*—Sara Crane
(74) *Attorney, Agent, or Firm*—Knobbe, Martens, Olson & Bear LLP

(57) ABSTRACT

A selectively doped trench isolation device is provided. The trench isolation device of the preferred embodiment includes a semiconductor substrate having a trench. A thin field oxide layer is grown on the side walls of the trench, and the trench is filled with a heavily doped polysilicon. The work function difference between the substrate and the heavily doped polysilicon increases the field threshold voltage of the gated trench isolation device so that smaller isolation structures can be formed between adjacent active devices in higher density integrated circuits.

9 Claims, 4 Drawing Sheets

U.S. PATENT DOCUMENTS

| | | | |
|---|---|---|---|
| 5,087,586 A | | 2/1992 | Chan et al. |
| 5,128,274 A | | 7/1992 | Yabu et al. |
| 5,173,438 A | | 12/1992 | Sandhu |
| 5,179,038 A | * | 1/1993 | Kinney et al. ............... 438/427 |
| 5,191,509 A | | 3/1993 | Wen |
| 5,302,233 A | | 4/1994 | Kim et al. |
| 5,356,828 A | | 10/1994 | Swan et al. |
| 5,358,894 A | | 10/1994 | Fazan et al. |
| 5,366,590 A | | 11/1994 | Kadomura |
| 5,429,995 A | | 7/1995 | Nishiyama et al. |
| 5,470,783 A | | 11/1995 | Chiu et al. |
| 5,492,736 A | | 2/1996 | Laxman et al. |
| 5,530,293 A | | 6/1996 | Cohen et al. |
| 5,565,697 A | * | 10/1996 | Asakawa et al. ............ 257/347 |
| 5,702,976 A | | 12/1997 | Schuegraf et al. |
| 5,859,466 A | | 1/1999 | Wada |
| 5,914,523 A | | 6/1999 | Bashir et al. |
| 6,781,212 B1 | * | 8/2004 | Kao et al. .................... 257/520 |

FOREIGN PATENT DOCUMENTS

| | | |
|---|---|---|
| JP | 62131539 | 6/1987 |
| JP | 01138730 | 5/1989 |
| JP | 09064164 | 3/1997 |

OTHER PUBLICATIONS

S.M. Sze, "*Semiconductor Devices-Physics and Technology*", pp. 195-197 (1985).

Stanley Wolf, *Silicon Processing for the VLSI Era*, vol. 2, Lattice Press, Sunset Beach, CA, pp. 12-83 (1990).

Kirk-Othmer, *Encyclopedia of Chemical Technology*, vol. 2, $2^{nd}$ Ed. 1967, pp. 791-792.

S.M. Sze, "*Physics of Semiconductor Devices*", John Wiley & Sons, 1981, XP002130269, p. 397, Figure 28.

* cited by examiner

SELECTIVELY DOPED TRENCH DEVICE ISOLATION

RELATED APPLICATIONS

This Application is a divisional application of U.S. patent application Ser. No. 09/143,585 filed Aug. 31, 1998 now U.S. Pat. No. 6,781,212 entitled "SELECTIVELY DOPED TRENCH DEVICE ISOLATION", which is hereby incorporated by reference in its entirety.

BACKGROUND OF THE INVENTION

1. Field of the Invention

The present invention relates to semiconductor device design and fabrication and more particularly to trench isolation of such devices.

2. Description of the Related Art

In the semiconductor industry, there is a continuing trend towards increasing the number of components formed in an area of an integrated circuit. This trend is resulting in Ultra Large Scale Integration (ULSI devices). This trend is driving the semiconductor industry to explore new materials and processes for fabricating integrated devices having sub-micron sized features so that more devices can be formed in the same area of an integrated circuit. This is particularly true for the manufacture of the Metal Oxide Semiconductor (MOS) or Complementary Metal Oxide Semiconductor (CMOS) Integrated Circuits (ICs).

Such ICs generally consist of an array of active devices such as transistors or capacitors. Typically, each of the capacitors and transistors are separated by an isolation structure that is adapted to electrically isolate adjacent active devices from each other. As device density has increased, the overall dimensions of the capacitors, transistors and the isolation structures on a chip have been reduced by the manufacturers to meet limited space requirements. Moreover, these devices are being placed in closer proximity to each other to increase device density. This situation presents a special challenge for the isolation structures as these devices must be smaller and yet still provide the necessary isolation. In fact, the integrity and the reliability of each active device greatly depends on ability to electrically isolate each active device from adjacent active devices as leakage currents from adjacent devices can result in failure. Thus, despite decreasing dimensions of isolation structures, each isolation structure must still maintain the required degree of isolation to prevent leakage currents between the individual active devices.

Active devices on a chip are generally spaced apart by the regions known as field regions in which the isolation structures are formed. In fact, isolation between the active devices is achieved by interposing the isolation structure, normally called a field device, therebetween to interrupt the parasitic conduction. In particular, it is understood that a difference in potential between adjacent active devices induces charge carriers to travel between the two active devices. The difference in potential is referred to as the threshold voltage required to produce this parasitic conduction.

In many applications, the isolation structure used to inhibit parasitic conduction is formed out of a generally non-conductive oxide material, such as silicon oxide. Preferably, the presence of the isolation structure increases the threshold voltage necessary to produce parasitic conduction to a point where the difference in potential between adjacent active devices never reaches the threshold voltage. This threshold voltage, in the context of isolation structures, is commonly referred to as the field threshold. With these types of isolation structures, the threshold voltage resulting from the formation of the isolation structure is proportionate to the thickness of the isolation structure. Hence, the thicker the structure, the greater the threshold voltage which results in less parasitic conduction during active device operation.

For clarity, the mechanism of parasitic conduction between active devices can be viewed as a parasitic device that is established between active devices. The parasitic device is analogous in operation to a field effect transistor. Consequently, the isolation structure, acting as a gate in a field effect transistor, increases the threshold voltage of the parasitic devices that spontaneously exist between the active devices and prevents inadvertent electrical coupling between the active devices. The goal in any isolation scheme, is to make this field threshold voltage as high as possible without adversely effecting the characteristics of adjacent devices. In the semiconductor industry, this is conventionally done by forming thick isolation structures in the field regions.

Such isolation structures are conventionally formed using processes such as LOCOS (For LOCalized Oxidation of Silicon) or trench isolation. In the LOCOS process, thick isolation structures known as field oxide regions are formed by oxidizing the regions between adjacent active devices. Although the high field threshold provided by such thick field oxide effectively isolates the active devices, the LOCOS process presents some disadvantages associated with the nature of the oxidation process. For example, thick isolation structures formed through oxidation consume a considerable amount of area on the chip limiting the amount of area available for active devices and thereby limiting the active device density. Moreover, during the oxidation process there is lateral encroachment into the active areas of the chip. This lateral encroachment is known as bird's beak encroachment and it further limits the size of the active areas of the chip and the active device density. This bird's beak encroachment remains a significant problem even as device dimensions and isolation structure dimensions are decreased to accommodate higher active device densities.

One alternative to the LOCOS process is known as trench isolation. Advantageously, trench isolation processes do not experience bird's beak lateral encroachment and resulting active area loss. Trench isolation generally involves etching a trench in the substrate between the active devices and filling the trench with an insulator such as silicon oxide. In order to provide high field threshold voltages and to prevent the formation of a conductive channel between neighboring active devices, the trench must have a sufficient depth and width.

However, scaling down trench dimensions to accommodate higher active device densities on an integrated circuit adversely affects the field threshold voltage and can result in parasitic conduction between the active devices. Consequently, while trench isolation techniques generally do not have the lateral encroachment problems associated with LOCOS isolation structures, trench isolation structures must still have relatively large minimum dimensions to maintain adequate isolation between adjacent active devices which inhibits significant increase in device density on an integrated circuit.

One solution to this problem is to use a channel-stop implant to dope side walls of the trench so as to further limit the formation of a conductive channel between the active devices. Channel-stop implants are usually the same dopant type as the dopant type of the substrate, but channel stop implants are implanted in higher doping concentrations to effectively limit the channel formation. However, doping trench walls is a tedious and technically difficult process, and the doped implant often has a tendency to diffuse into active device regions, resulting in undesirable changes in device characteristics.

One other alternative trench isolation method fills the trench with polysilicon. In this method device isolation can be achieved by applying a low bias to the polysilicon so as to prevent channel formation between the active devices. However, as the trench dimensions are reduced, the field threshold voltage of these isolation structures may not be adequately high enough to prevent channel formation. Moreover, as in the case of silicon oxide filled trenches, poly filled trenches may still require side wall channel stop implants.

Thus, in semiconductor integrated circuit technologies, there is need for isolation structures having high field threshold voltages and improved isolation characteristics so as to provide isolation between adjacent active devices in higher active device density applications. To this end, there is a need for isolation structures that reduce channeling between adjacent devices but do not require time consuming doping processes to achieve adequately isolating structures.

SUMMARY OF THE INVENTION

The aforementioned needs are satisfied by the process and device of the present invention which is directed to manufacture of a selectively doped trench isolation device. In one aspect, the present invention is comprised of an isolation structure formed in a substrate of a semiconductor material having a first work function, the isolation structure comprising a trench formed in the substrate with an insolation layer positioned on the trench surfaces and a material having a second work function, different from the first work function, that is positioned inside of the trench on the exposed surface of the insulating layer. In one aspect, the isolation material is of the same dopant type as the substrate but has a higher dopant concentration. In one aspect, the isolation material is formed of a material that can be biased so as to increase the threshold voltage of the isolation structure.

In another aspect of the invention, a method of forming an isolation structure is provided. The method is comprised of forming a trench in a substrate of a first work function, depositing an isolation or insulating layer on the inner surfaces of the trench and then positioning a material having a second work function, different from the first work function on the inner surfaces of the isolation or insulating material. In one embodiment, the isolation material is adapted to form a gate that can be biased.

In one embodiment of the present invention, a trench is formed in a field region of a p-type substrate and a thin layer of field oxide is formed on the trench side walls and the floor. The oxide covered trench is then filled with a material having work function value that is higher than the work function value of the p-type substrate. In this embodiment the material is a heavily doped P+ polysilicon material. The higher work function of the P+ polysilicon material produces a high flat band voltage that produces high threshold voltages. This high threshold voltage of the trench isolation device prevents current leakages between the active devices that are separated by the trench isolation device of this invention. Further, this threshold voltage can advantageously be controlled by varying the bias on the gate material. Moreover, in this embodiment, the dopant atoms from the polysilicon diffuse through the isolation layer thereby forming a higher doped channel stop region adjacent the interface between the substrate and the isolation region without requiring the use of channel implants or side wall-implants.

These and other objects and advantages of the present invention will become more fully apparent from the following description taken in conjunction with the accompanying drawings

DETAILED DESCRIPTION OF THE PREFERRED EMBODIMENT

Figure 1:
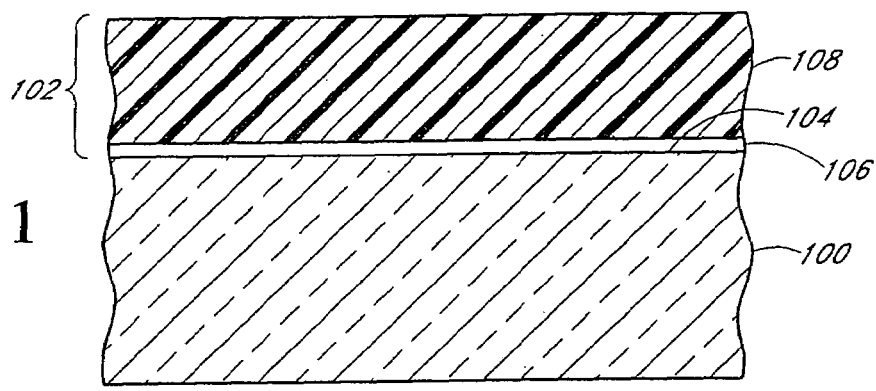
FIG. 1 is a schematic view of a silicon substrate having a mask structure formed on top of the substrate.

Reference will now be made to the drawings wherein like numerals refer to like parts throughout. FIG. 1 illustrates a semiconductor substrate 100 where a mask structure 102 is formed on a top surface 104 of the substrate 100. In this embodiment, the semiconductor substrate 100 preferably comprises a p-type silicon substrate, and the mask structure 102 may be comprised of a silicon oxide layer 106 and a nitride layer 108. The silicon oxide layer 106, often referred to as pad-oxide layer, may be formed by oxidation of the top surface 104 using any of a number of well-known wet or dry oxidation techniques so as to grow a silicon oxide layer with a thickness on the order of approximately 30 to 300 Angstroms. The nitride layer 108 may be formed on the pad-oxide layer 106 using any of a well-known deposition processes, preferably a Chemical Vapor Deposition (CVD) process. The nitride layer may preferably be deposited to a thickness of approximately 1000-2500 A.

Figure 2:
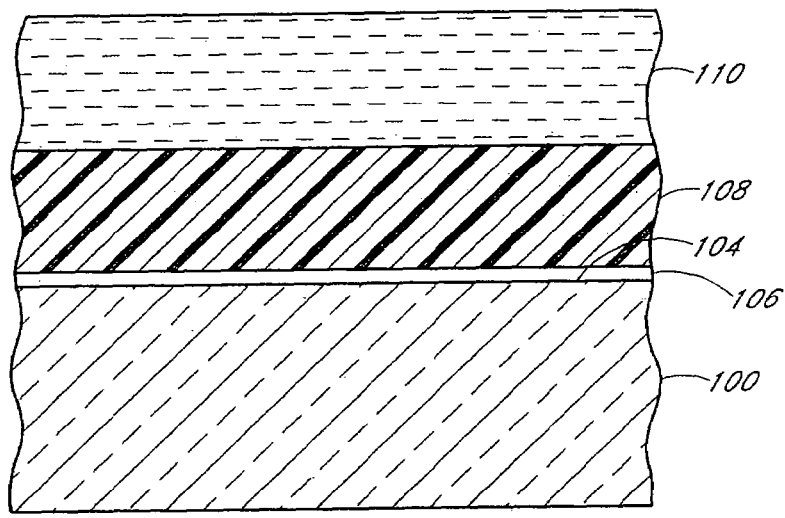
FIG. 2 is a schematic view of the structure shown in FIG. 1 wherein a layer of photo resist material has been formed on top of the mask structure.
Figure 3:
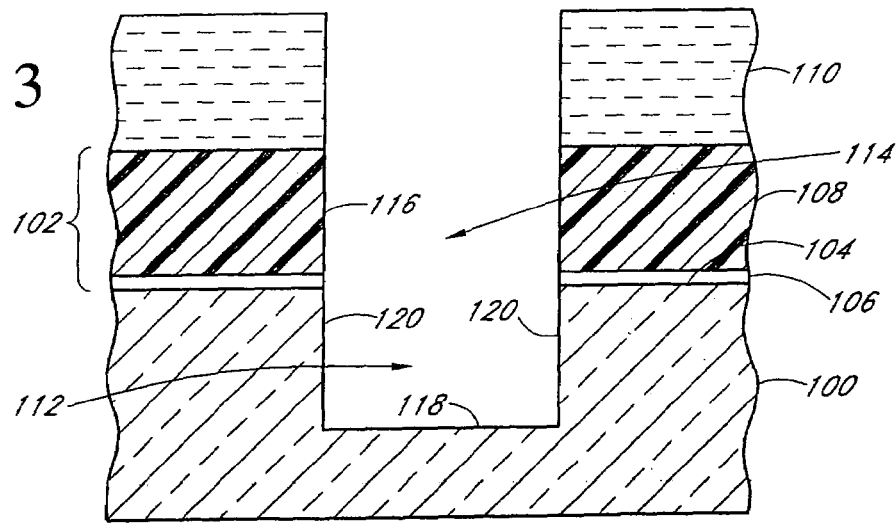
FIG. 3 is a schematic view of the structure shown in FIG. 2 wherein the mask structure and the silicon substrate have been etched to form a trench in the substrate.

As shown in FIG. 2, following the deposition of the nitride layer 108, a resist layer 110 is formed on the nitride layer 108 through conventional resist forming techniques. Thereafter, as illustrated in FIG. 3, a trench 112 is formed in the substrate 100 by patterning and defining the resist layer 110, and subsequently etching the masking structure 102 and substrate 100 to form the trench 112 within the substrate 100. The patterning and definition of the resist layer 110 can be carried out using any of a well-known conventional photolithographic techniques in the art.

More particularly, a selective etch process may initially be used to etch an aperture 114, which has side walls 116, through the mask structure 102. The trench 112 is then etched in the substrate through the aperture 114. Etching of the substrate 100 continues until a floor 118 of the trench 112 is horizontally formed at a selected depth within the substrate 100, while side walls 120 of the trench 112 extend generally vertically downwardly from the interface between the substrate 100 and the mask structure 102. Etching of the mask structure 102 and the substrate 100 may be performed using a dry etch technique, such as a Reactive Ion Etching (RTE) technique, in a manner well known in the art of semiconductor processing so that the trench 112 is formed with generally vertical sidewalls 120.

Figure 4:
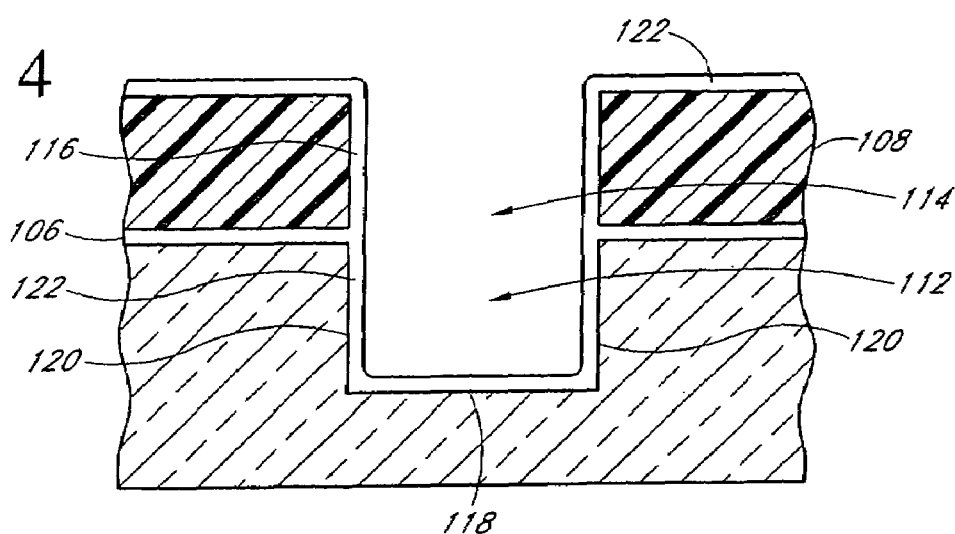
FIG. 4 is a schematic view of the structure shown in FIG. 3 wherein the photo resist material has been stripped from the mask structure, and a silicon oxide layer is formed on the exposed surfaces of the trench and the mask structure.

As illustrated in FIG. 4, the resist layer 110 is then removed from the top of the nitride layer 108. Subsequently, a layer 122 of a first material may be formed on the floor 118 and the side walls 120 of the trench 112 as well as side walls 116 and the top of the nitride layer 108. In this embodiment, the first material layer 122 comprises an isolation material layer and is preferably a silicon oxide layer. As will be described further hereinbelow, the silicon oxide layer 122 forms the field oxide layer of the gated trench isolation device of this embodiment. The silicon oxide layer 122 may be formed using either a well known a deposition or a well known oxidation technique to a thickness range of approximately 50-500 Å depending upon the technology and chip operating voltage.

As illustrated in FIG. 4, a second material 124 is deposited on the field oxide layer 122 so as to fill trench 112, aperture 114 and to cover the top surface of the nitride layer 108. As will also be described further hereinbelow, the second material 124 is connected to the contact element or the gate of the field isolation device of this embodiment.

In this embodiment, the second material 124 preferably comprises a material having a work function value that is higher than the work function value of the material forming the substrate 100 (p-type impurity doped silicon). As is well known to those skilled in the semiconductor art, the work function is a specific material parameter which may be defined as a threshold energy required to remove an electron from a material. In one embodiment, the second material 124 may comprise a selectively heavily p-type impurity doped polysilicon (P+ poly) material having a work function value of approximately 5.2 electron volts. In this embodiment, the P+ poly material comprises polysilicon with a p-type doping impurity introduced therein, preferably Boron with a preferred doping concentration range of approximately $10^{19}$-$10^{21}$ atoms cm$^{-3}$. The second material 124 is used in conjunction with a p-type silicon substrate 100 having a doping concentration of approximately $10^{14}$-$10^{15}$ atoms cm$^{-3}$ and a work function of approximately 4.9 electron volts. Alternatively, as will be discussed below, the second material 124 can also be an n-type impurity doped polysilicon material (N+ poly). This IN+ poly has a work function value of 4.17 electron volts.

Figure 6:
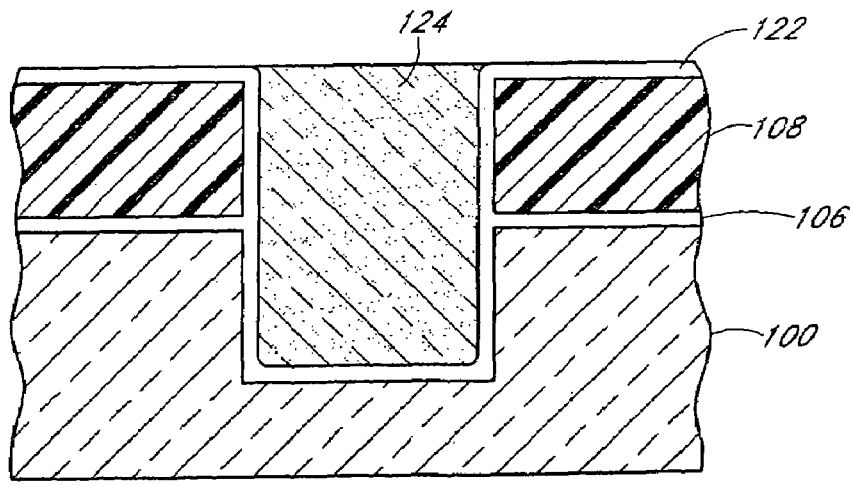
FIG. 6 is a schematic view of the structure shown in FIG. 5 wherein P+ polysilicon layer has been planarized.
Figure 7:
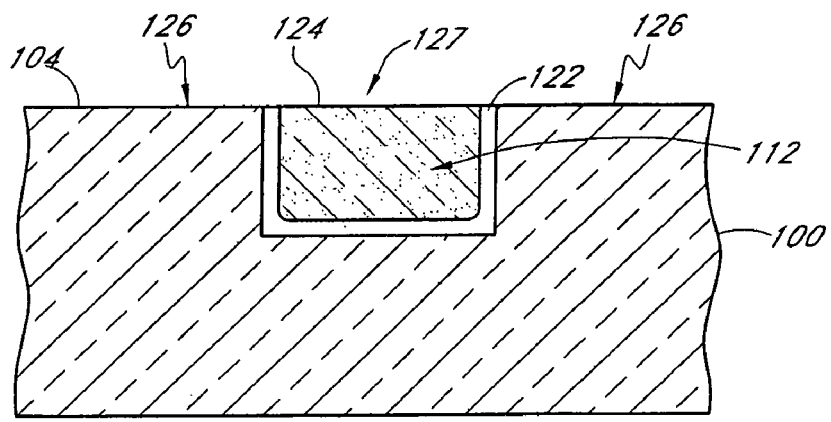
FIG. 7 is a schematic view of the structure shown in FIG. 6 wherein a gated mask structure has been removed and the P+ poly material has been further planarized to form a gated trench isolation device.

As illustrated in FIGS. 6-7, once the second material 124 is deposited on the field oxide layer 122, the second material 124 is then planarized down to the level of a portion of the oxide layer 122 which is on top of the nitride layer 108. A chemical mechanical polishing (CMP) process may preferably be used to planarize the second material 124. Alternatively, however, a dry etch process may also be used to remove this second material layer. As shown in FIG. 7, the second material 124 is then further planarized down to the level of the first surface 104 of the substrate 100 preferably removing the nitride layer 108 and the pad oxide 106 so as to reveal the adjacent active areas 126a, 126b and an embodiment of a field isolation device 127 interposed therebetween. The field isolation device 127 has the field oxide layer 122 and the second material 124.

As an alternative to using CMP to remove the masking stack 108 and the pad oxide 106, the second material may be selectively dry etched down to the level of the active areas 126a, 126b while the remaining portions of the mask structure 108 protects underlying active areas 105 from being etched. After this etching is complete, the mask structure 108 and the exposed portions of the field oxide layer 122 are removed using suitable dry or wet etch processes.

Hence, the process results in the formation of the isolation structure 127 having the oxide layer 122 on each of the inner surfaces of the trench 112 and the second material 124 positioned inside of the oxide layers 122. As discussed above, the P+ poly material comprises a high work function material when compared to the material of the substrate 100 while the N+ poly material comprises a low work function material when compared to the material of the substrate 100. Hence, the field isolation device 127 is comprised of a isolation material that is positioned within a trench so as to be interposed between two materials (e.g., P+ poly and the substrate) having positively different work functions or two materials (e.g., N+ poly and the substrate) having negatively different work function.

It is known that, for a MOS gate structure, the work function difference between a metal (or polysilicon) and semiconductor, which both are connected through an oxide interlayer so as to form a metal-oxide-semiconductor structure, is generally defined as the flat band voltage of that structure. The flat band voltage is a well-known concept to those skilled in the semiconductor art. It is further known in the art that, in a MOS gate structure, the threshold voltage is a strong function of a flat band voltage. A positively different work function between the P+ poly and the p-doped substrate results in a larger threshold voltage than that of a negatively different work function.

Consequently, it will be appreciated that the field isolation device 127 has an increased field threshold voltage as a result of using materials to form the isolation structure that has a positive work function difference from the material forming the substrate. As previously mentioned, field threshold voltage is the voltage at which an inadvertent current flow (leakage) between the active devices may occur. Thus, the higher the field threshold voltage is, the less likely there will be a leakage current between adjacent active devices. In this embodiment, the resulting high work function difference between the p-doped substrate 100 and the P+ poly material advantageously increases field threshold voltage of the isolation structure thereby preventing shortages between the adjacent devices.

Figure 5:
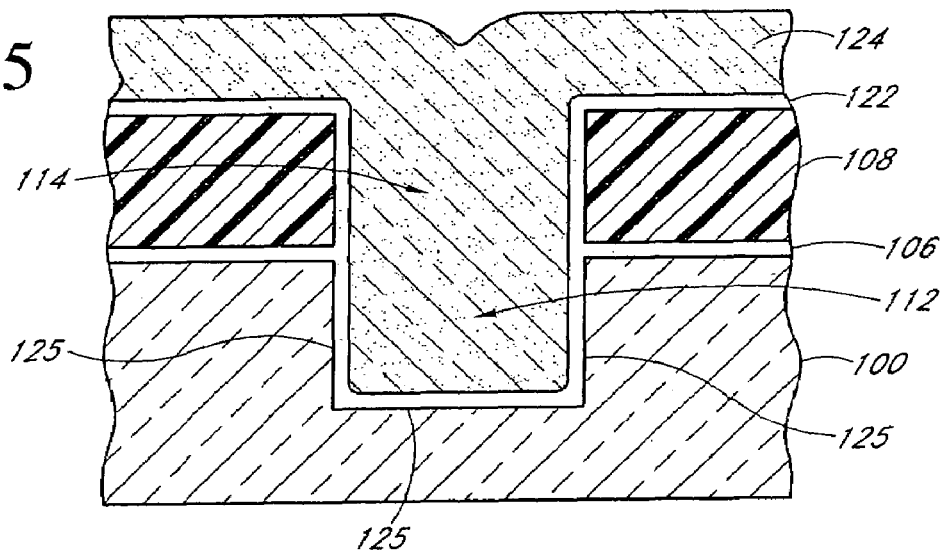
FIG. 5 is a schematic view of the structure shown in FIG. 4 wherein a P+ polysilicon layer has been selectively deposited on the silicon oxide layer to fill the trench.

Moreover, as illustrated in FIG. 5, doping implant in the heavily doped second material 124 will diffuse through the field oxide layer 122 to create a dopant impurity rich region 125 at the interface between the substrate 100 and the field oxide layer 122. This dopant rich region 125 acts like a channel stop region further increasing the field threshold voltage and inhibiting leakage across the isolation device 127. As discussed, a channel-stop region further enhances the field threshold voltage and inhibits parasitic conduction. Hence, the process of the preferred embodiment results in the creation of channel stop implants adjacent the side walls of the isolation device 127 without requiring the use of tedious and expensive channel stop implant techniques. Consequently, the field isolation device 127 of this embodiment may have a field threshold voltage of at least 10 volts.

Figure 8:
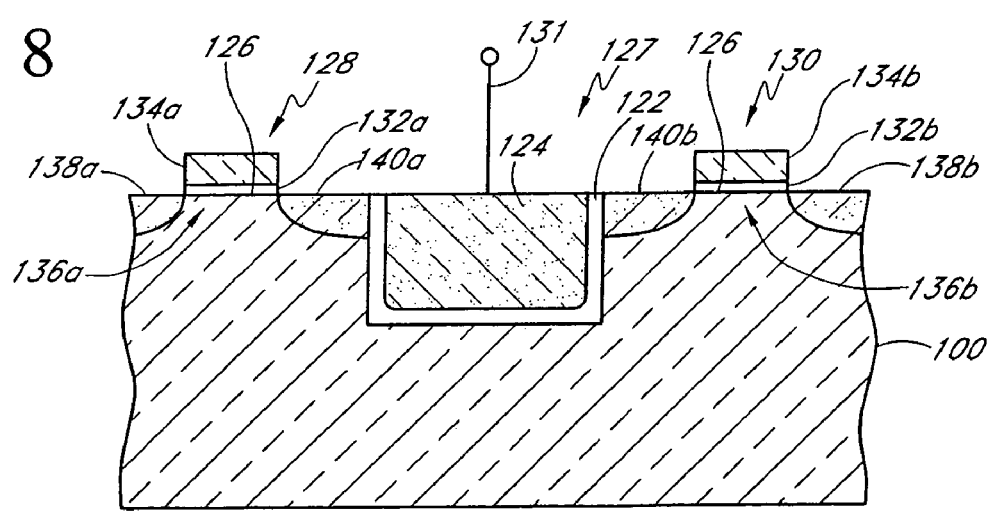
FIG. 8 is a schematic view of the structure shown in FIG. 7 wherein transistors have been formed adjacent the gated trench isolation device.

As illustrated in FIG. 8, following the formation of the field isolation device 127, a pair of exemplary transistors (MOSFETS), namely the first transistor 128 and the second transistor 130, may be formed on the either side of the field isolation device 127. In the illustrated embodiment, a contact element 131 is connected to the second material 124 of the field device 127 so that a bias voltage can be applied to the second material 124. However, the contact element can be replaced with a conventional gate structure (not shown) which generally comprises a layer of gate oxide deposited on the second material, and a polysilicon layer deposited on the gate oxide layer. As shown in FIG. 8, the first transistor 128 comprises a gate oxide layer 132a located between a gate electrode 132a and a channel region 136a. The transistor 128 also have a source and drain regions 138a and 140a which may be formed as doped diffused regions as in the manner shown in FIG. 8. Similarly, the second transistor 130 has a gate oxide layer 132b, a gate electrode 132b, a channel region 136b as well as source and drain regions 138b and 140b. The transistors 128 and 130 are formed using methods which are well-known in the semiconductor device manufacturing technologies.

As explained above, when P+ poly is used as the second material 124, due to the positive work function difference between the P+ poly material and the p-type substrate 100 and resulting high flat band voltage, the field isolation device 127 introduces higher threshold voltages and thus prevents current leakages between the transistors 128 and 130. Further, this threshold voltage can advantageously be controlled by varying the bias on the second material 124.

Figure 9A:
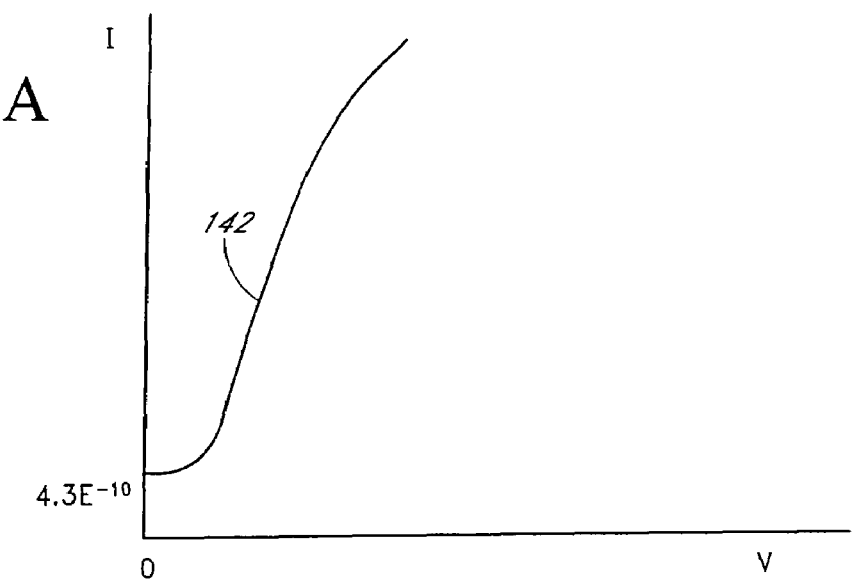
FIGS. 9A-9C show I-V curves comparing leakage currents of three separate exemplary trench isolation devices.
Figure 9B:
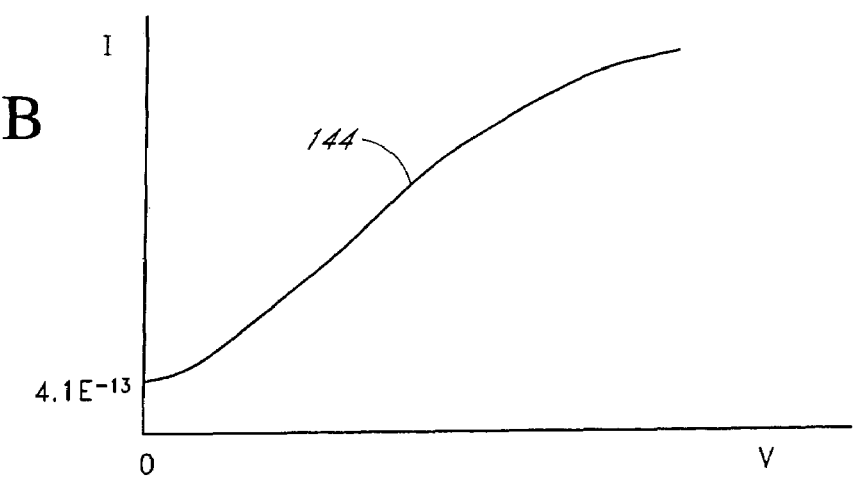
Figure 9C:
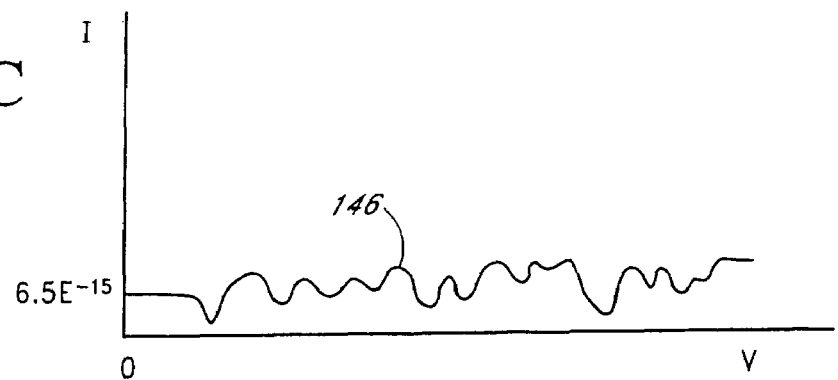

Experimentally, doped polysilicon isolation structures exhibit superior leakage characteristics compared to that of a silicon oxide (SiO$_2$) isolation device of the prior art when these devices are tested at an isolation scheme that is similar to one shown in FIG. 8. For example, FIGS. 9A-9C are current-voltage characteristics for three NMOS trench isolation devices having trench depth of 0.3 μm, junction depth of 0.2 μm and V$_{bs}$=−1 Volt (bulk to substrate voltage), a trench width of 1 μm, and a given trench length common for each device (0.2 μm in this case). The isolation structures can be modeled as a transistor with the isolation device forming a gate and the two active areas forming a drain and a source. Under quiescent conditions (V$_{gs}$=0 volts and V$_{ds}$=10 Volts), the resulting punch through current leakages (current leakages from the trench isolation test devices) are indicated on current-voltage curves shown in FIGS. (9A-9B). As shown by curve 142 in FIG. 9A, for the silicon oxide filled trench isolation device of the prior art (i.e., the trench is etched in the substrate and filled with SiO$_2$), the punch through leakage current corresponds to 4.3E −10 Amperes/trench width (μm) under above given conditions. This undesirably high leakage is due to varying surface potential along the SiO$_2$-substrate interface region so that when the device is biased at 0 volts, the potential on this interface, or channel, is not always 0 volts. In such devices, near the drain region, this surface potential is generally greater than zero, thus causing a leakage current from the drain side.

As shown by the curve 144 in FIG. 9B, for an N+ poly filled trench device, this leakage current is approximately reduced three orders of magnitude down to 4.1E −13 Amperes μm (current/trench width). As noted above, an N+ poly filled trench device can be formed with the same process used for forming a P+ poly filled device (i.e., there is an SiO$_2$ layer between the N+ poly and the substrate). However, differing from the SiO$_2$ filled trench, when the N+ poly is biased at 0 volts, the potential along the SiO$_2$-substrate interface region, or channel, is almost 0 volts. This, in turn, significantly reduces the leakage currents.

As shown in FIG. 9C by the curve 146, for the trench isolation device incorporating a P+ poly filled trench, this leakage current is at least 5 or more orders of magnitude lower than the current leakage that occurred in the prior art trench oxide device down to approximately 6.5E −15 Amperes μm (current/trench width). These results are taken to be representative of the isolation device of the present invention, and results represented herein further demonstrates the superior isolation characteristics of the field isolation device of the present invention.

Although the unique aspects of the preferred embodiment are disclosed in connection with n-channel metal-oxide-semiconductor (NMOS) IC technology, the same inventive aspects can also be applied to the p-channel metal-oxide-semiconductor (PMOS) technology, the complementary metal-oxide-semiconductor (CMOS) technology and the metal-oxide-semiconductor (MOS) memory technologies without departing from the spirit of the present invention.

Although the foregoing invention has been described in terms of certain preferred embodiments, other embodiments will become apparent to those of ordinary skill in the art, in view of the disclosure herein. Accordingly, the present invention is not intended to be limited by the recitation of preferred embodiments, but is instead intended to be defined solely by reference to the appended claims.

What is claimed is:

1. A semiconductor integrated circuit comprising;
   a semiconductor substrate having a first work function value, said substrate defines a first active area having a first active device and a second active area having a second active device;
   an isolation structure which includes a trench formed in said substrate between said first and second active areas and further includes an insulating layer positioned on the side walls of said trench and a second material filling said trench so that said insulating layer is interposed between the substrate and the second material wherein said second material comprises a material having a second work function value which is greater than the first work function value of said substrate; and
   a contact element electrically connected to said second material and a voltage source, wherein said contact element is adapted to apply a bias voltage to the second material in a manner so as to increase the threshold voltage of the isolation structure.

2. The semiconductor integrated circuit of claim 1, wherein said substrate is a p-type silicon substrate.

3. The semiconductor integrated circuit of claim 1, wherein said first work function value is approximately 4.9 electron volts.

4. The semiconductor integrated circuit of claim 1, wherein said second work function value is approximately 5.2 electron volts.

5. The semiconductor integrated circuit of claim 1, wherein said insulating layer comprises silicon dioxide (SiO$_2$).

6. The semiconductor integrated circuit of claim 1, wherein said second material is comprised of P+ polysilicon material, said P+ polysilicon material comprises a dopant material with a concentration range of $10^{19}$-$10^{21}$ atoms cm$^{-3}$.

7. The semiconductor integrated circuit of claim 6, wherein said dopant material is boron.

8. The semiconductor integrated circuit of claim 6, wherein a channel stop layer is formed at an interface between said trench surface and said insulating layer as a result of diffusion of dopant materials from said P+ polysilicon material into said substrate.

9. The semiconductor integrated circuit of claim 8, wherein the work function difference between the silicon substrate and the P+ polysilicon material induces a threshold voltage sufficient to prevent electrical conduction between said active devices.

* * * * *

UNITED STATES PATENT AND TRADEMARK OFFICE
CERTIFICATE OF CORRECTION

| | | |
|---|---|---|
| PATENT NO. | : 7,259,442 B2 | Page 1 of 1 |
| APPLICATION NO. | : 10/920579 | |
| DATED | : August 21, 2007 | |
| INVENTOR(S) | : Kao et al. | |

It is certified that error appears in the above-identified patent and that said Letters Patent is hereby corrected as shown below:

Title Page;
In field (75), in "Inventors", in column 1, line 2, delete "Boise, ID (US)" and insert -- Meridian, ID (US) --, therefor.

Signed and Sealed this

Thirteenth Day of November, 2007

JON W. DUDAS
*Director of the United States Patent and Trademark Office*